(12) United States Patent
Bentolila et al.

(10) Patent No.: US 6,492,793 B1
(45) Date of Patent: Dec. 10, 2002

(54) HIGH EFFICIENCY SWITCHING DC-DC REGULATOR

(75) Inventors: Ariel S. Bentolila, Santa Clara, CA (US); Sisan Shen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 63 days.

(21) Appl. No.: 09/588,399

(22) Filed: Jun. 6, 2000

(51) Int. Cl.[7] ................................................. G05F 1/40
(52) U.S. Cl. ....................................... 323/282; 323/351
(58) Field of Search ................................. 323/222, 282, 323/283, 284, 313, 314, 315, 351

(56) References Cited

U.S. PATENT DOCUMENTS

| | | | |
|---|---|---|---|
| 5,420,777 A | 5/1995 | Muto | ........................ 363/21 |
| 5,731,731 A | 3/1998 | Wilcox et al. | ............... 327/403 |
| 5,912,552 A | 6/1999 | Tateishi | ....................... 323/285 |
| 5,969,514 A | * 10/1999 | Merrill | ........................ 323/283 |

* cited by examiner

*Primary Examiner*—Jessica Han
(74) *Attorney, Agent, or Firm*—William B. Kempler; W. James Brady; Frederick J. Telecky, Jr.

(57) ABSTRACT

A synchronous switching DC-DC regulator uses the output switching node as the control reference for the main FET gate drive voltage limiting and the appropriate on-time gate drive FET as the controlled switch. The control reference provided by the output switching node times the main FET gate drive voltage setting process and supplies most of the energy necessary to turn on the main FETs. The energy is provided in part from an external inductor coupled to the output switching node.

49 Claims, 14 Drawing Sheets

HIGH EFFICIENCY SWITCHING DC-DC REGULATOR

BACKGROUND OF THE INVENTION

1. Field of the Invention

This invention relates generally to switching DC-DC regulators, and more particularly, to switching DC-DC regulators that maintain high light load efficiency at a fixed switching frequency when using large external FET switching devices.

2. Description of the Prior Art

Switching DC-DC regulators having large output FET devices capable of switching synchronously at high frequencies (greater than 680 kHz) and at light loading are well known. These known devices use any one or more known techniques in their attempts to attain higher light load efficiency. These techniques, however, rely on methods that are not always possible to implement, or otherwise do not meet the needs of integrated circuit applications such as integrated circuits defined by cellular phone specifications. A significant problem associated with light loading is that more power is lost in turning a large FET switch on and off, than that lost due to the resistance of the switch itself.

Basic variables associated with power loss relating to switching DC-DC regulators are seen in the well known power loss equation (1) below:

$$P_{loss} = 2 C_g {}^* V_{gs}{}^{2^*} f_s + R_{ds}ON^* I^2/3T_s \qquad (1)$$

where $f_s$ is the switching frequency, $R_{ds}ON$ is the switch on resistance, $C_g$ is the gate capacitance, $V_{gs}$ is the gate switching voltage, I is the current through a switching device, and $T_s$ is the switching period. At light loads, the switching frequency $f_s$ term dominates, so presently known techniques seek to minimize it. U.S. Pat. No. 5,912,552, entitled DC to DC Converter With High Efficiency for Light Loads, issued Jun. 15, 1999 to Tateishi, discloses use of a burst mode that reduces $f_s$ by passing more energy each time and that randomly turns on when needed. This technique is useful only in cases that can tolerate high ripple and broad spectrum noise. This technique is not, however, acceptable in many RF applications. U.S. Pat. No. 5,731,731, entitled High Efficiency Switching Regulator with Adaptive Drive Output Circuit, issued Mar. 24, 1998 to Wilcox, et al., discloses reduction of $C_g$ with a smaller switch during light loading conditions. This technique is a good strategy when the output FET devices are integrated into the IC. This technique, however, is very costly in parts count, PCB area and pin count when the output FET devices are external to the IC. This technique is however, unacceptable for certain integrated circuit applications such as compact, cost sensitive cell phone applications. U.S. Pat. No. 5,420,777, entitled Switching Type. DC-DC Converter Having Increasing Conversion Efficiency At Light Load, issued May 30, 1995 to Muto, disclosing a technique for reducing V$gs$. This technique, however, applies only to nonsynchronous boost applications. Further, the technique of Muto is not feasible at high switching frequencies since a comparator can not act fast enough, given the current state of processing technology. Moto does not disclose or suggest a method or structure for limiting the P-side FET gate voltage to $V_{dd}-V_{gs}$, which is necessary to accommodate a synchronous switcher topology. High power and current switching regulator ICs, such as those described herein above, often have efficiencies below 30% at low current loads.

In view of the foregoing, a need exists for a switching regulator technique capable of maintaining high light load efficiency at a fixed high switching frequency f, when using large external FET devices.

SUMMARY OF THE INVENTION

The present invention is directed to a switching regulator capable of maintaining high light load efficiency at a fixed switching frequency $f_s$, even when using large external FET devices. The switch node ($SW_n$) is used as a control reference for the $V_{gs}$ gate drive limiting; and the appropriate on-time gate drive FET as the controlled switch. The switch node ($SW_n$) precisely times the $V_{gs}$ setting process and provides substantially all of the energy necessary to turn on the main FET devices. The drive signals are like those for a typical switching regulator. The output driver FET, $P_{on}SW$, that turns on the main PMOS device, and the output driver FET, $N_{on}SW$, that turns on the main NMOS device, however, each have their source referenced to the switch node ($SW_n$) instead of $V_{dd}$ or ground respectively.

In one aspect of the present invention, a MOS-based switch mode power converter has the gate drive of the output FET devices configured such that the on-time driver FET device has its source connected to the output switch node.

In another aspect of the present invention, a switching regulator detection circuit is provided that senses the output switch node voltage to determine light load conditions.

In still another aspect of the present invention, a switching regulator voltage setting circuit is provided to drive the gate switching voltage $V_{gs}$ of the output FET device to a predetermined minimal value that guarantees FET turn-on and generates a signal to end the $V_{gs}$ setting process.

In yet another aspect of the present invention, a switching regulator technique is provided whereby the on-time driver FET device recirculates substantially all the gate drive energy necessary by reusing normally wasted inductor energy.

In another aspect of the present invention, a MOS-based switch mode power converter is provided to establish exact timing parameters necessary to turn off the gate drive of the out FET devices.

In still another aspect of the present invention, a switching regulator is provided that automatically clamps the output FET device switch node in discontinuous mode to limit ringing to one $V_t$ above $V_{dd}$ or below ground when all output FET devices are off.

In yet another aspect of the present invention, a switching regulator is provided that guarantees a minimum gate drive speed during normal load conditions as determined by a light load detection circuit.

In still another aspect of the present invention, a switching regulator is provided that guarantees the output FET device turns on during light loading conditions as determined by a light load detection circuit.

In another aspect of the present invention, a switching regulator is provided whereby a multiplicity of gate drive devices operate to assist the on-time driver FET device to quickly turn on the output FET device, thereby preserving die area.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
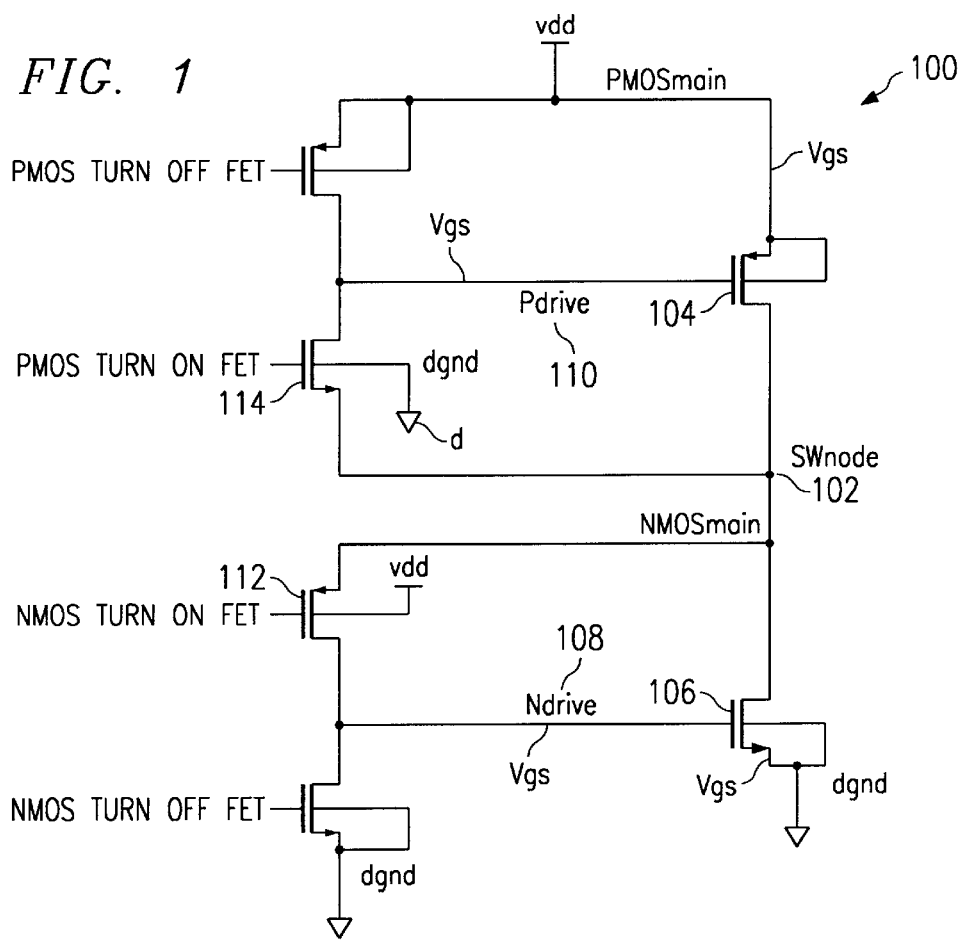
FIG. 1 illustrates a switching regulator output stage according to one embodiment of the present invention.
Figure 2:
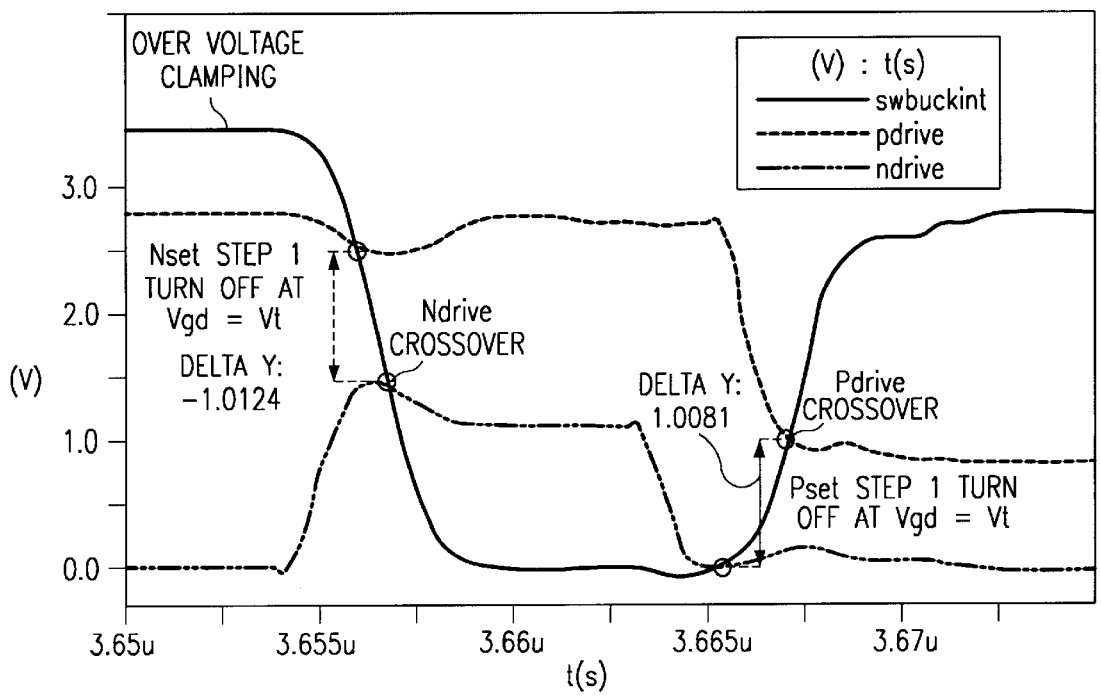
FIG. 2 is a graph illustrating how the output stage depicted in FIG. 1 operates to eliminate ringing at the output switching node when operating in a discontinuous mode and just prior to turning on the main PMOS.

The present invention is best understood with reference to FIGS. 1 and 2, and by first setting forth a description of the gate switching voltage $V_{gs}$ setting process associated with the main output FET devices targeted for low $V_{gs}$ operation. FIG. 1 illustrates a switching regulator output stage 100 according to one embodiment of the present invention; and FIG. 2 is a graph illustrating how the output stage 100 depicted in FIG. 1 operates to eliminate ringing at the output switching node 102 when operating in a discontinuous mode and just prior to turning on the main PMOS 104. The gate switching voltage $V_{gs}$ setting process begins first by driving the appropriate output MOSFET, e.g. 104, 106 to its on mode. The present state of the output switching node 102, however, must be in the identical state resulting from the last switching transition before starting the next transition. This requirement is guaranteed in synchronous modes of operation, and for the N-drive 108. A problem arises, however, for the P-drive 110 that is caused from the discontinuous mode since the output switching node 102 will ring and will not provide a maximum output switching node 102 voltage pull down benefit. The worst case results when the output switching node 102 voltage is actually greater than the difference between the supply voltage $V_{dd}$ and the respective FET turn-on threshold voltage ($V_t$). A solution for this problem is to force the output switching node voltage to ground immediately prior to starting the next switching transition. The present invention includes a "self-clamping" technique that uses the residual energy in the output switching node 102 to turn on the main NMOS FET 106 thereby grounding the output switching node 102 and achieving the desired voltage pull down benefit. This technique is achieved via turning on the driver 112 of the main MOSFET 106 that clamps the output switching node 102 as desired.

FIG. 2 illustrates the voltage waveforms appearing at the output switching node 102, the N-drive 108 and the P-drive 110 and exemplifies the present buck technique whereby the N-drive 108, driven by the output switching node 102 voltage, effectively grounds the discontinuous mode ringing immediately prior to turning on the main PMOS FET 104. The foregoing self-snubbing requires that the output switching node 102 voltage be greater than the requisite FET threshold voltage in order to turn on the main NMOS FET 106. Otherwise, a much smaller snubbing NMOS is sufficient to ground the output switching node 102. Using the otherwise wasted ringing energy to accomplish the above described self-snubbing avoids the potentially significant cost of turning on a large snubbing FET during each cycle.

Once the output switching node 102 is clamped to either ground or the supply voltage, the respective main FET gate is driven by the switching node 102 until the absolute values of the appropriate gate switching voltage $V_{gs}$ exceed $V_t$ and $V_{ds}$ of the respective main FET, herein after referred to as "crossover" point, where $V_t$ is the FET turn-on threshold voltage as stated herein before. In each case, after reaching the "crossover" point, the source and drain of the NMOS turn on FET ($N_{on}SW$) 112 and the PMOS turn on FET ($P_{on}SW$) 114 effectively reverse and the output switching node 102 begins to force the gate switching voltage to at least one $V_t$ above ground or below supply voltage respectively. At this point, each output MOSFET 104,106 is guaranteed marginally on since the gate drive automatically adjusts itself to turn on the main FET and clamp $V_{gs}$ to at least one $V_t$. Significantly, a smaller $V_t$ increases the energy transferred from the output switching node 102 to the main MOS gate drives 108, 110.

Once the main FET's gate switching voltage $V_{gs}$ has been set at or slightly above the threshold voltage $V_t$, the process continues by activating the $V_{set}$ devices to set the final gate switching voltage $V_{gs}$ levels. The $V_{gs}$ setting portion of the process then begins when the output switching node ($SW_n$) 102 is within $V_t$ of its final state, indicating that the appropriate output MOSFET 104, 106 is fully on. This $V_{gs}$ setting portion of the present process can be implemented in a multiplicity of ways. Exemplary techniques, for example, that can be used to accomplish this $V_{gs}$ setting may include diode drop clamping; use of a linear regulator; FET clamping with a reference voltage, where the reference voltage. can be set using various resistor/diode and current source architectures or using a linear regulator; switch node FET clamping with a reference voltage as set forth above; and FET forcing of $V_{set}$ with a reference voltage as set forth above. The present invention is not so limited however, and it shall be understood that other techniques and circuit architectures can also be successfully used to implement the present $V_{set}$ process so long as the requisite functionality disclosed and claimed-herein is retained.

Figure 3:
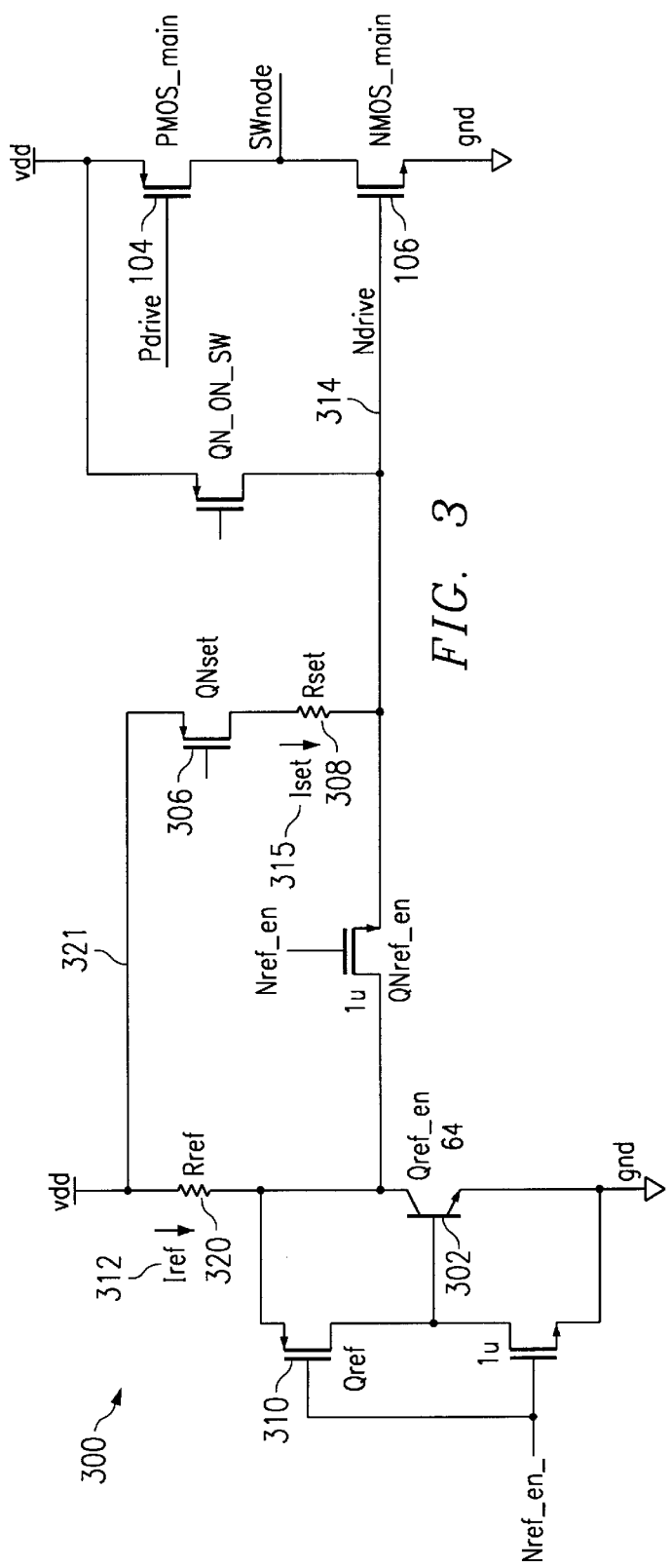
FIG. 3 illustrates a diode drop clamping circuit suitable for use in setting the gate switching voltage for the main output FET devices of a switching regulator according to one embodiment of the present invention.

FIG. 3 illustrates a typical circuit architecture that can be used to implement the above referenced diode drop clamping technique. Specifically, FIG. 3 illustrates a diode drop clamping circuit 300 suitable for use in setting the gate switching voltage $V_{gs}$ for the main output NMOS FET device 106 of a switching regulator according to one embodiment of the present invention. A dual circuit architecture similarly applies for the PMOS FET 104. This $V_{gs}$ setting process centers around using the $V_{be}$ drop of a diode connected NPN transistor 302 as a reasonable voltage reference. The $Q_{ref}$ FET 310 enables the diode reference transistor 302 and the $ON_{set}$ FET 306 forces $V_{gs}$ to a voltage determined by the voltage division between the diode reference transistor 302 and a resistor $R_{set}$ 308. Most preferably, the $Q_{ref}$ FET 310 and the $Q_{set}$FET 306 are large enough to ensure that their respective $R_{ds}ON$ is much less than $R_{set}$308 to provide functionality stability over a wide temperature range. This requirement is driven by a wide, up to 200%, variation of $R_{ds}ON$, and hence $V_{set}$, versus the resistance variation of less than 10% normally associated with a discrete resistor over the same temperature range. Since $V_{be}$ is logarithmically dependent upon $I_{ref}$ 312, any process variations in $I_{ref}$312 cause only very small changes in $V_{be}$. The reference turn on switch, $Q_{ref}$FET 310, is placed in the base-collector path of the diode reference transistor 302 to reduce its size since $I_b$ is much less than $I_c$. This process works by charging $C_g$ of the Output FET 106 with $R_{set}$ 308 until the diode reference transistor 302 turns on and clamps the node 314 to $V_{set}$. The value of $I_{set}$ 315, hence $R_{set}$ 308, will then determine the setting speed and the diode voltage drop. These parameters are seen to be affected by the supply voltage $V_{dd}$.

Figure 4:
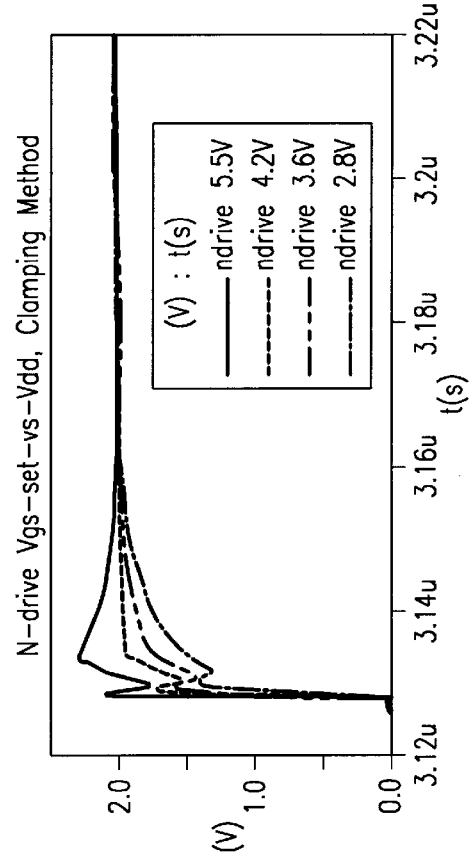
FIG. 4 illustrates how the N-drive gate switching voltage varies with the supply voltage in a particular application for a predetermined supply voltage range using the diode drop clamping circuit shown in FIG. 3.

FIG. 4 illustrates how the N-drive 314 gate switching voltage of diode drop clamping circuit 300 varies over a 2.8–5.5 volts $V_{dd}$ range that is implemented by application of a fixed voltage source, rather than $V_{dd}$ to circuit path 321. The set point $V_{gs}$ is seen to be highly accurate and only overshoots well beyond the minimal operation level. When the set point target is 2.0 volts with a supply voltage of 3.6 volts, there is a +/-12% change in the $V_{gs}$ set point over the typical operating range of 2.8–4.2 volts. This implies that a nominal gate switching voltage $V_{gs}$ can then be centered simply by modifying $R_{set}$ 308, $R_{ref}$ 320 and the $V_{be}$ for the diode connected NPN transistor 302. This architecture is advantageous when simplicity of design is more important than achieving extremely high accuracy.

Figure 5:
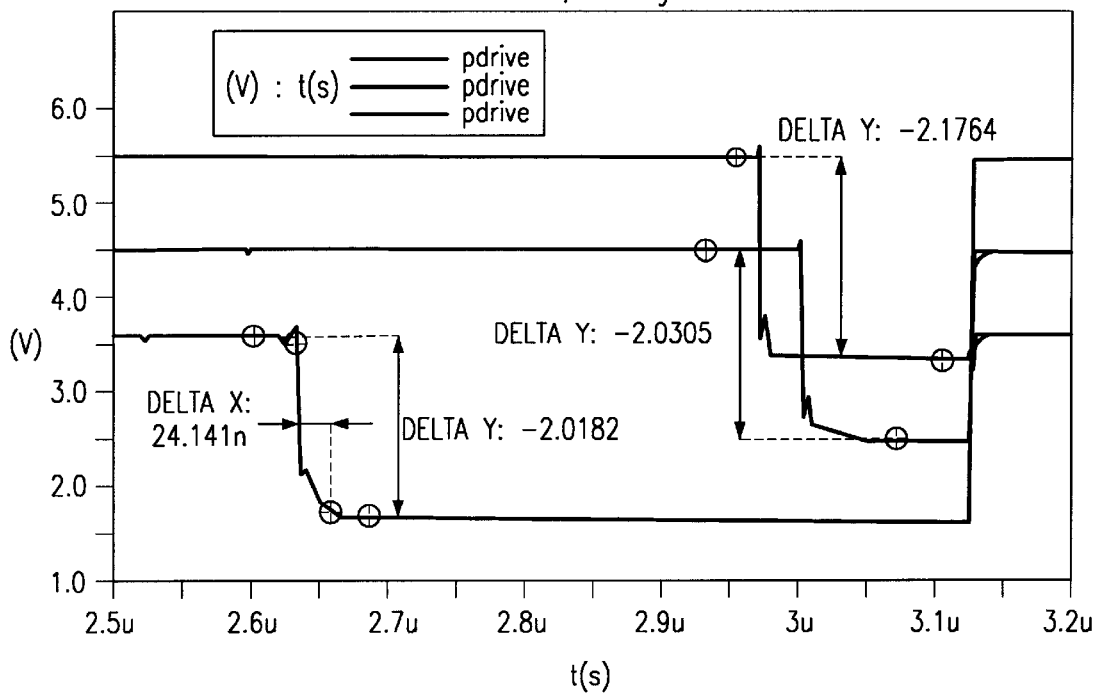
FIG. 5 illustrates how the P-drive gate switching voltage varies with the supply voltage in a particular application for a predetermined supply voltage range using FET forcing in combination with a reference voltage according to one embodiment of the present invention.

FIG. 5 illustrates how the P-drive gate switching voltage varies with the supply voltage $V_{dd}$ in a particular application for a predetermined supply voltage range using a forcing set method discussed further herein below. It is seen that the P-side experiences about 15% error at higher voltages where overshoot is eliminated.

Figure 6:
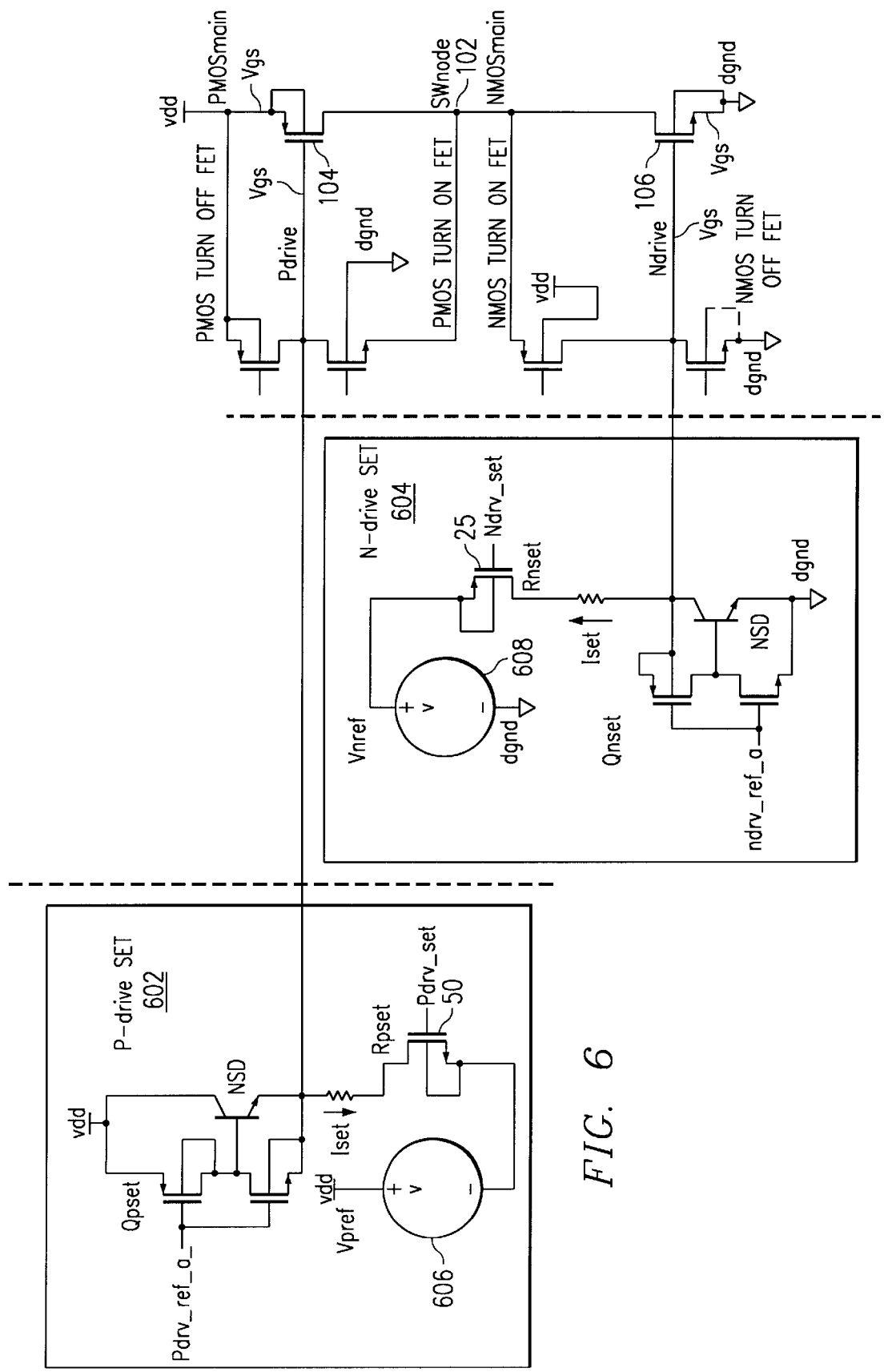
FIG. 6 illustrates a technique of diode drop clamping in combination with a linear regulator reference to optimize the gate switching voltage accuracy associated with the main output FET devices of a switching regulator according to one embodiment of the present invention.

FIG. 6 illustrates a technique of diode drop clamping in combination with a linear regulator reference to optimize the gate switching voltage $V_{gs}$ accuracy associated with the main output FET devices 104, 106 of a switching regulator according to one embodiment of the present invention. A fixed voltage reference 602, 604 achieves the desired setting accuracy. The voltage references 602, 604 fix $I_{set}$ and $V_{be}$ to a repeatable value independent of the supply voltage $V_{dd}$. This increased setting accuracy is, however, achieved only with increased costs and higher quiescent current consumption. Gate current efficiency is generally degraded when the current is provided via a linear regulator. Since the present method uses the switch node 102 to turn on the FET 104, 106, very little current is required to set the final value of $V_{gs}$. The-impact on light load efficiency would be very significant if the voltage references 602, 604 were resistive and used for turning on each FET 104, 106, as is typically done in association with known switching regulators. Circuit 400, however, significantly reduces any variation of $V_{set}$ with $V_{dd}$ while holding $V_{ref}$ 606, 608 and diode parameters constant.

Figure 7:
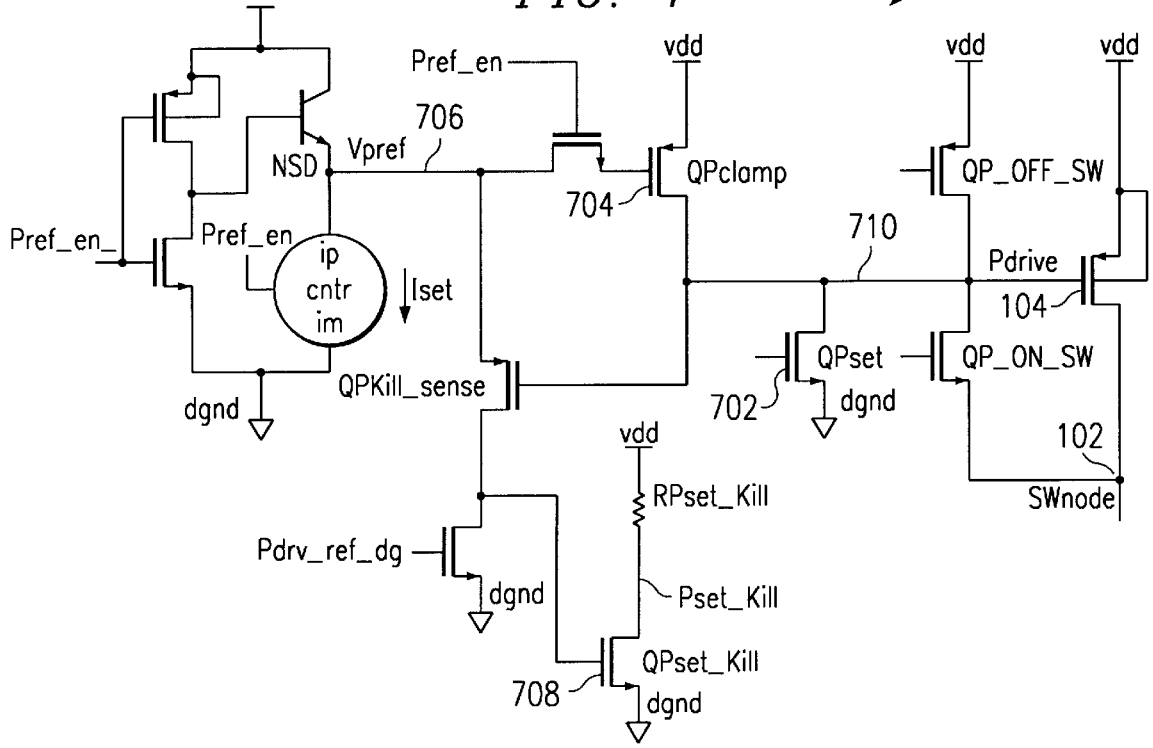
FIG. 7 illustrates a technique including an isolated FET voltage clamp implemented with a reference current and diode combination suitable for use in setting the gate switching voltage for the main output FET devices of a switching regulator according to one embodiment of the present invention.

A FET clamping/reference voltage techniques can be used to achieve reasonable accuracy without the necessity to accommodate the costly fixed voltage references discussed herein before. This technique establishes a reference voltage on the gate of a FET whose source monitors the gate drive, and then acts to limit $V_{gs}$ via $V_{set}$ when $V_{gs}$ is one $V_t$ from $V_{ref}$. FIG. 7 illustrates a technique including isolated FET clamping in combination with a reference voltage set by a current source/diode combination suitable for use in setting the gate switching voltage $V_{gs}$ for the main output FET devices 104, 106 of a switching regulator according to one embodiment of the present invention. A small FET, $QP_{set}$ 702, associated with the P-drive, acts to pull $V_{gs}$ of the output PMOS FET 104 towards full on. As $V_{gs}$ approaches $V_{set}$, it will begin to turn on the much larger clamping FET, $QP_{clamp}$ 704 if $V_{ref}$ 706 is set appropriately. While the clamping FET 704 holds the gate drive node 710 at $V_{set}$, a parallel sensing FET, $QP_{setkill}$ 708, detects when the clamp turns on and sends a signal to terminate the setting process. The output PMOS FET 104 gate switching voltage $V_{gs}$ is left floating at the $V_{set}$ potential. This method applies to the P-drive and N-drive equally. The setting accuracy depends on the variation in $V_{ref}$ 706 and the $V_t$ of $QP_{clamp}$ 704. These variations can cause about a 20% to about a 30% change in $V_{set}$.

Figure 8:
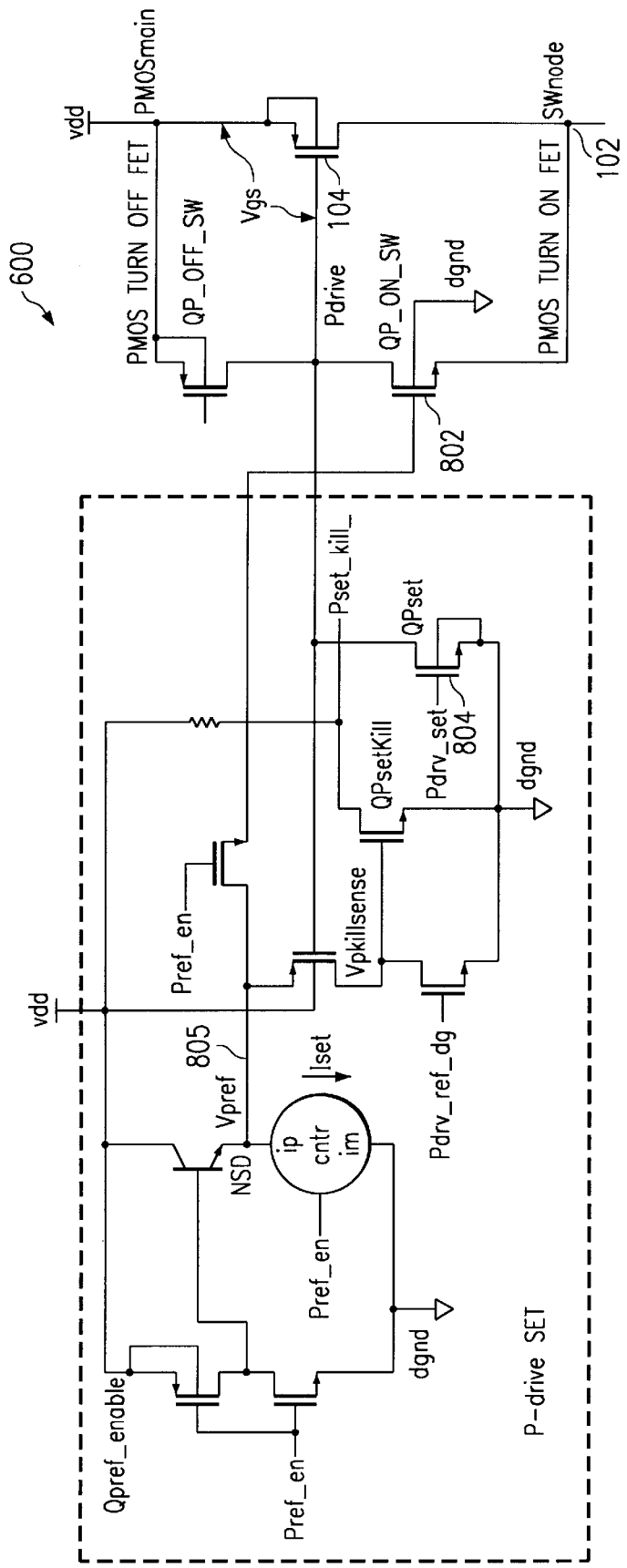
FIG. 8 illustrates a technique implemented with a dual use FET clamp in combination with a reference voltage set by a diode and a current source suitable for use in setting the gate switching voltage for the main output FET devices of a switching regulator according to one embodiment of the present invention.

FIG. 8 illustrates a variant of the technique described herein above with reference to FIG. 7, including switch node FET clamping in combination with an appropriate reference voltage suitable for use in setting the gate switching voltage $V_{gs}$ for the main output FET device 104 of a switching regulator according to one embodiment of the present invention. Specifically, this technique uniquely accommodates a dual use of the existing gate drive FET, QP_ON_SW 802 as more fully described herein below. As described above in association with clamping the gate switching voltage $V_{gs}$ at approximately the threshold voltage $V_t$ below $V_{pref}$ 805 during the first portion of the present process, the existing gate drive FET, QP_ON_SW 802 acts to transfer energy from the output switching node 102 to the gate of the output FET 104 presently turning on. Once this FET 104 is on, the switching node 102 is guaranteed to have switched to a supply potential opposite that established just before its state change. In the instant case, the symmetry of FET construction allows the drain and source of QP_ON_SW 802 to effectively reverse roles. QP ON_SW 802 will then act to clamp $V_{gs}$ to within one $V_t$ of the gate voltage, $V_{ref}$, on QP ON_SW 802, and use the output switching node 102 as a clamping power source. A limitation associated with this technique is directed to a *reverse recovery time related to the foregoing state change for QP ON SW 802 that prevents it from clamping the $V_{gs}$ immediately following the clamping of $V_{gs}$ to within one $V_t$ of the gate voltage. This occurs because the drain to source current $I_{ds}$ of QP_ON_SW 802 during the second portion of the $V_{gs}$ setting process flows opposite to that during the first portion of the $V_{gs}$ setting process and therefore must reverse the conduction channel charge distribution associated with QP_ON_SW 802. This slower clamping time allows $V_{gs}$ to overshoot $V_{set}$ until QP_ON_SW 802 recovers and begins clamping. This method is particularly useful in applications where the speed of the gate drive transition is slow enough to allow for a desired wait state, i.e., until QP_ON_SW 802 recovers and the setting process can begin. When a wait state is not desired, the stand-alone clamping FET technique discussed above with reference to FIG. 7 can provide a workable solution. In both cases, the $R_{ds}$ON of QP$_{set}$ 804 must be much less than that of QP$_{clamp}$ 806. This requirement can force QP$_{clamp}$ 806, to be quite large since its gate drive tends to be only one $V_t$, unlike QP$_{set}$ 804, which gets the full supply voltage $V_{dd}$ for its gate drive.

Figure 9:
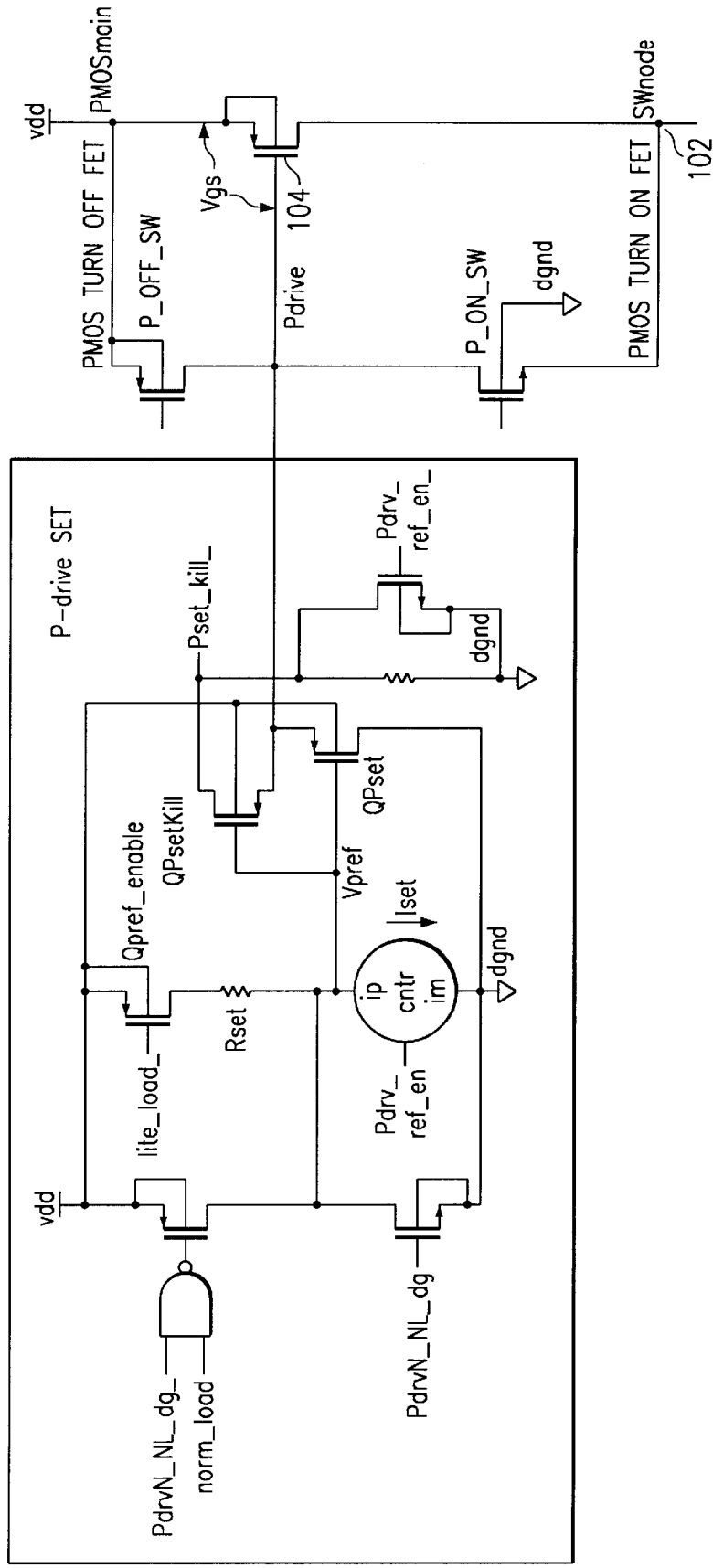
FIG. 9 illustrates a technique including FET forcing in combination with a reference voltage set by a current source/resistor combination suitable for use in setting the gate switching voltage for the main output FET devices of a switching regulator according to one embodiment of the present invention.
Figure 10A:
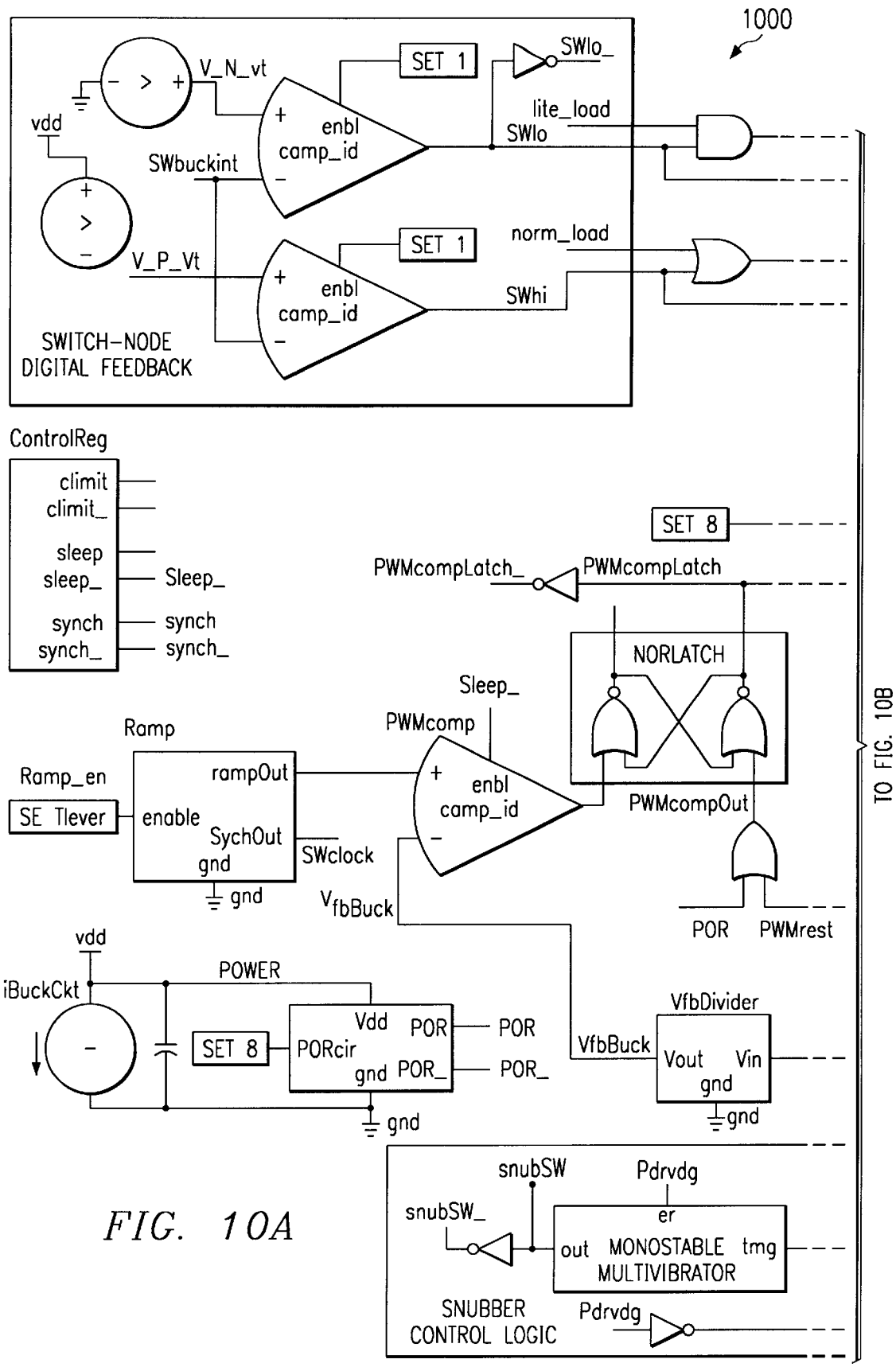
FIG. 10 illustrates a complete low gate switching voltage, light load sensitive implementation of a buck switching regulator according to one preferred embodiment of the present invention.
Figure 10B:
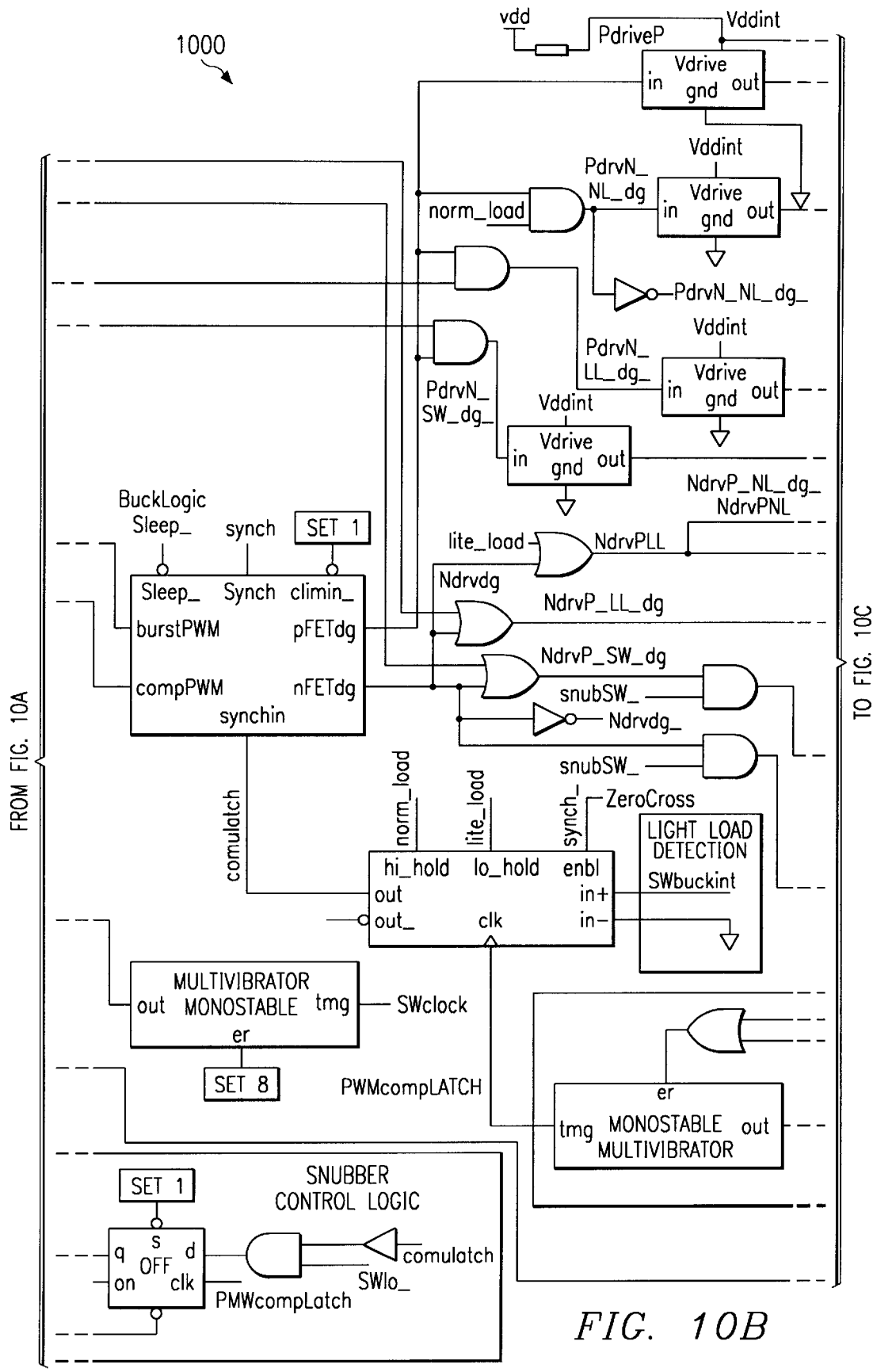
Figure 10C:
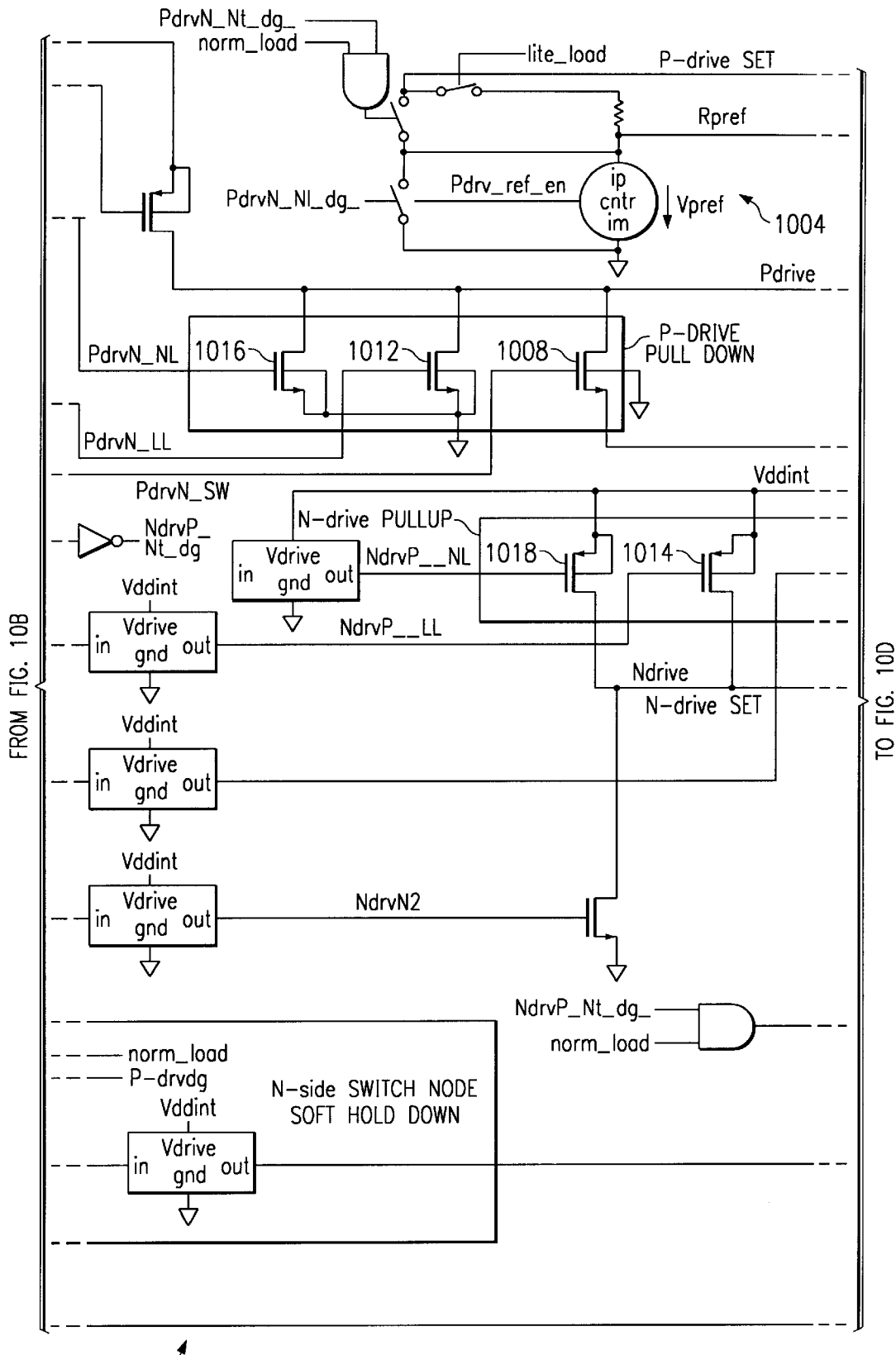
Figure 10D:
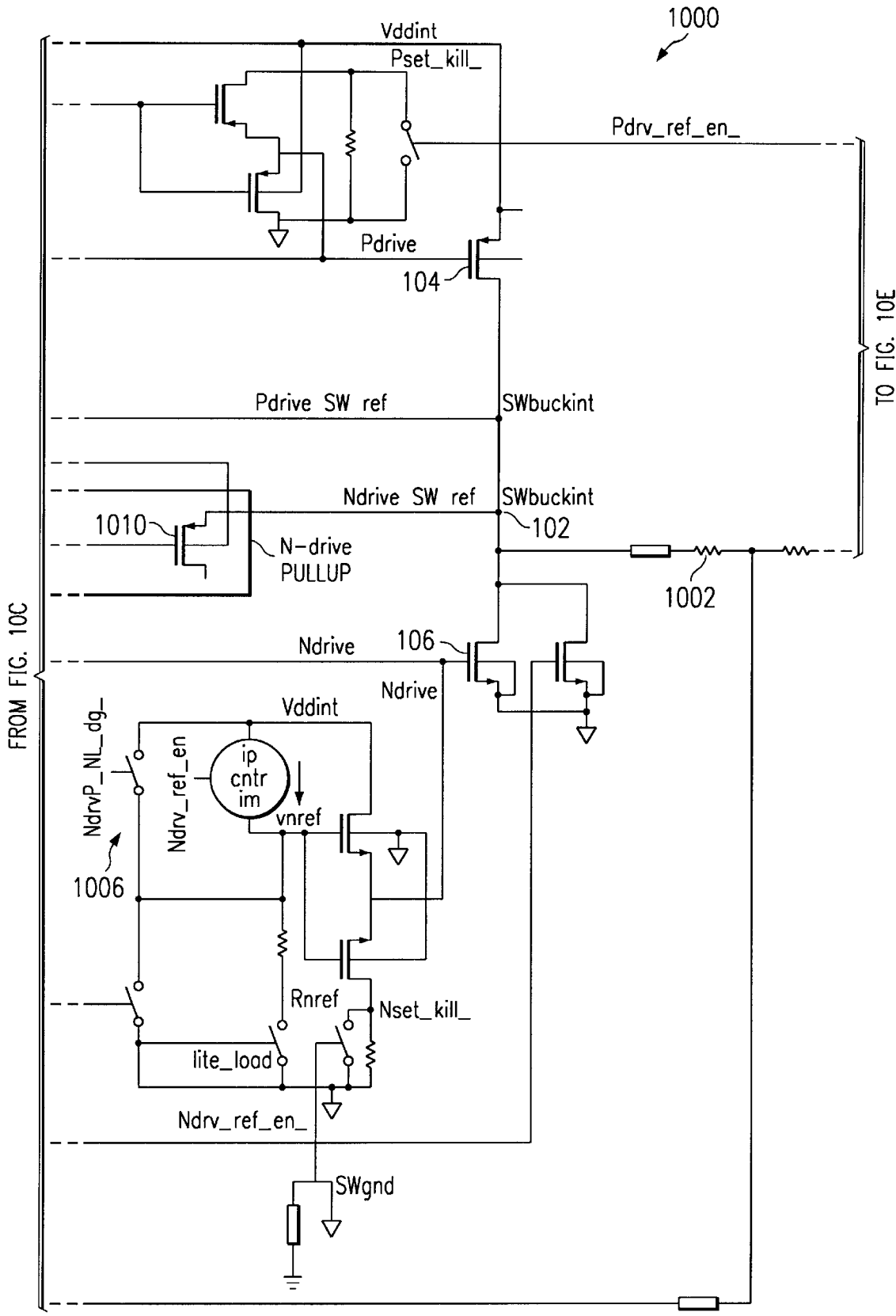
Figure 10E:
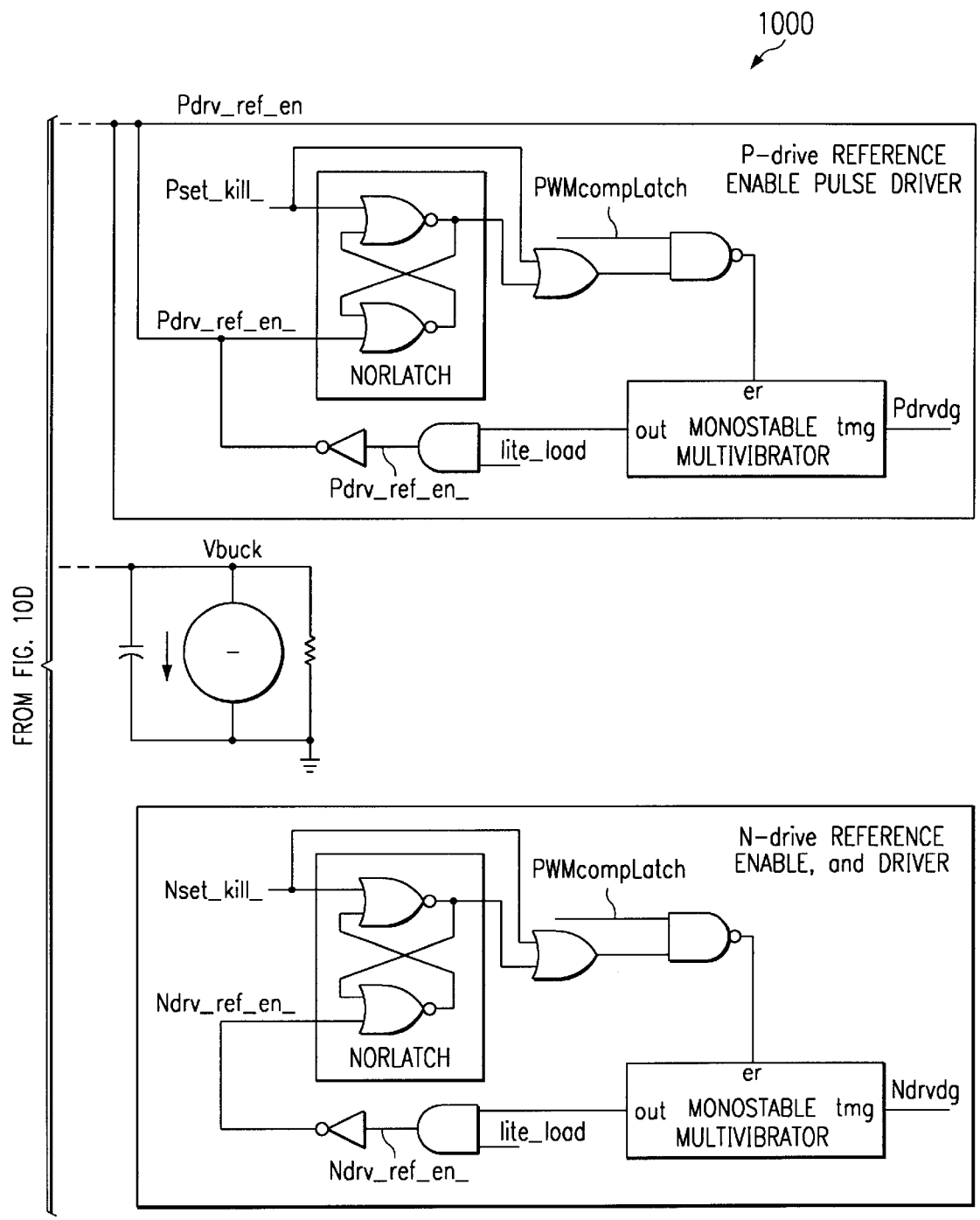

FIG. 9 illustrates a technique including FET forcing in combination with a reference voltage set by a resistor and a current source suitable for use in setting the gate switching voltage $V_{gs}$ for the main output FET device 104 of a switching regulator according to one embodiment of the present invention. This technique uses a $V_{gs}$ forcing concept to overcome the penalties associated with the structure of FIG. 7, e.g. 1) requiring a large QP$_{set}$ FET; 2) lost energy when QP$_{clamp}$ fights QP$_{set}$ to hold the P-drive node at a certain voltage; and 3) the large variation in $R_{ds}$ON with varying $V_{dd}$ associated with the QP$_{set}$ FET. The instant $V_{gs}$ forcing concept is very similar to the foregoing clamping schemes described above, except the N and P channel Q$_{clamp}$ FET devices are replaced with their respective complement devices, thereby creating active setting FETs (Q$_{set}$ devices). This architecture has the effect of pulling $V_{gs}$ towards $V_{set}$ until the gate drive bias of Q$_{set}$ gently tapers off as $V_{ref}$-$V_{gs}$ goes below $V_t$. This mechanism, unlike those discussed herein before, is largely independent of the supply voltage $V_{dd}$, and varies only with the process range of $V_t$, $I_{set}$ and $R_{set}$. Further, the size of Q$_{set}$ is much smaller since it gets a larger gate drive and only needs to supply a very small current to lift the main output FETs 104, 106 after they are turned on. Most preferably, $_t$ should be as small as possible since it limits the minimum supply voltage $V_{dd}$ according to $V_{ref}$=$V_{set}$+$V_t$. As will be described in more detail herein below, another significant benefit of the instant forcing method is that Q$_{set}$ can also be used to assist turn on of the output FETs 104, 106 during the normal, full $V_{gs}$ operating mode.

FIG. 10 illustrates a complete low gate switching voltage $V_{gs}$, light load mode implementation of a buck switching regulator 1000 according to one preferred embodiment of the present invention. The present inventors realized the need for maximum flexibility of design to accommodate easy adjustment of parameters necessary to meet certain specifications for a given application. This flexibility, for example, must accommodate robustness and allow for typical failure modes of a type that permit useful, but possibly less efficient operation. The buck switching regulator 1000 shown in FIG. 10 and described herein below, achieves these goals. Regulator 1000 employs a combination of techniques described above to accommodate turn-on of the main output FET devices 104, 106. Known techniques are very different from those described herein in that they generally employ one very large FET device that functions to pull energy from the supply to the gate of the output FET in order to control switching, independent of loading.

The present technique uses a two-fold approach, as described herein, to accommodate switching control of output FET devices. The output FET devices 104, 106 are first turned on with energy taken from the output switch node 102. The output switch node 102 voltage is then used to time the start of the requisite gate switching voltage $V_{gs}$ setting procedure. The gate drive transition must occur within a requisite period of time to guarantee a minimum duty cycle operation at the highest supply voltage $V_{dd}$ and for the largest output FET devices 104, 106 specified for a particular embodiment of the switching regulator. 1000. Although the switching regulator 1000 shown in FIG. 10 is best suited for integrated circuit technology, it will also perform the requisite functionality when applied to discrete embodiments of the present invention. Light load conditions are sensed at the output switching node 102 using the above described discontinuous operating mode. Further, energy is. supplied to the output switching node 102 via an inductor 1002. Thus, when the switching node 102 goes positive for example, the inductor 1002 is devoid of current and is charging in the reverse direction. This crossover point is load dependent and occurs when the average output current $I_0$ minus switching current $I_{ind}$ goes negative; or light_load is when $I_0$−0.5*$I_{ind}$ is less than zero (0). A desired light_load trigger point can thus be reliably implemented by choosing the inductor 1002 to accommodate a specified trip range over the supply voltage $V_{dd}$. The trigger point setting is not critical to implementation of the present invention so long as the requisite system specifications are met for worst case operating conditions. When in light_mode, the gate switching voltage $V_{gs}$ of the output FET devices 104, 106 is limited to a voltage set by the respective drive_set blocks 1004, 1006 in a manner described above for the present $V_{gs}$ setting process. Thus, in step 1, each Q$_{on}$_SW FET 1008, 1010 turns on its respective main output FET device 104, 106. Additional energy, if necessary however, is provided from the power supply via respective light_load FET (Q$_{drv}$LL) devices 1012, 1014 to ensure fast turn-on times for the main output FET devices 104, 106. The light_load FET (Q$_{drv}$LL) devices 1012, 1014 are therefore intended to be small devices incorporated primarily to further maximize robustness. In contrast thereto, each Q$_0$n_SW FET 1008, 1010 is most preferably chosen large enough to provide the requisite functionality under worst case operating conditions. In step 2 of the present $V_{gs}$ setting process, a Q$_{set}$ FET device within the respective drive_set blocks 1004, 1006, forces $V_{gs}$ to the desired $V_{set}$ gate drive voltage level. Once set, the output FET device 104, 106 gate is left floating and fully on until it is turned off in a manner well known to those familiar with PWM controller art.

Figure 11:
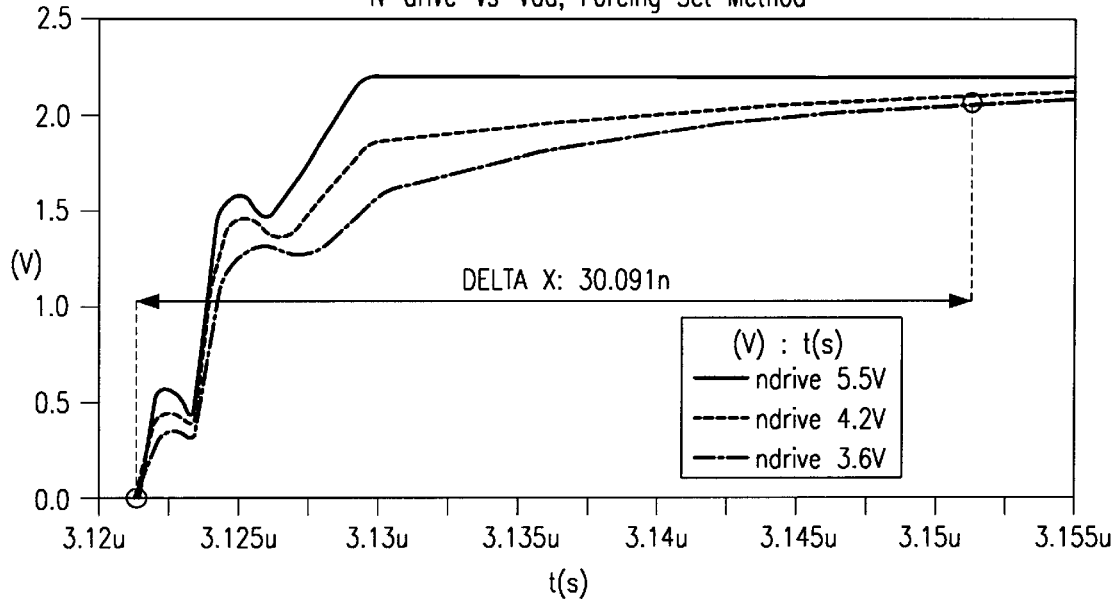
FIG. 11 is a graph illustrating the N-drive voltage response for a predetermined range of supply voltages for the switching regulator shown in FIG. 10.

FIG. 11 is a graph illustrating a simulated N-drive voltage response for a predetermined range of supply voltages for the switching regulator 1000 shown in FIG. 10, in which all device parameters are held constant over the supply voltage $V_{dd}$ range. Results are shown for the N-drive in its light load mode with a targeted 2.1 volts $V_{gs}$ that transitions within 30 nsec over a supply voltage $V_{dd}$ range of 3.6 volts to 5.5 volts.

In the normal load mode, each $Q_{on}$_SW FET 1008, 1010 again ensures the respective output FET device 104, 106 is turned on. With reference now again to FIG. 10, each $Q_{on}$_SW FET 1008, 1010 is associated with a respective parallel $Q_{drv}$NL FET 1016, 1018 that activates to guarantee $V_{gs}$ will transition across the full supply voltage $V_{dd}$ range within a specified maximum time. Each parallel $Q_{drv}$NL FET 1016, 1018 is most preferably small such that it is capable of driving the output switching node 102 beyond where its respective $Q_{on}$_SW FET 1008, 1010 turns off. All the FET devices, $Q_{drv}$NL, $Q_{drv}$LL, $Q_{on}$_SW and $Q_{set}$ most preferably turn on simultaneously to fully employ the assets of the present invention. This is important since the die area normally required to meet a desired specification for the output FET in a standard, prior-art structure, necessarily must equal the total die area of these FET devices employed by the present invention.

Figure 12:
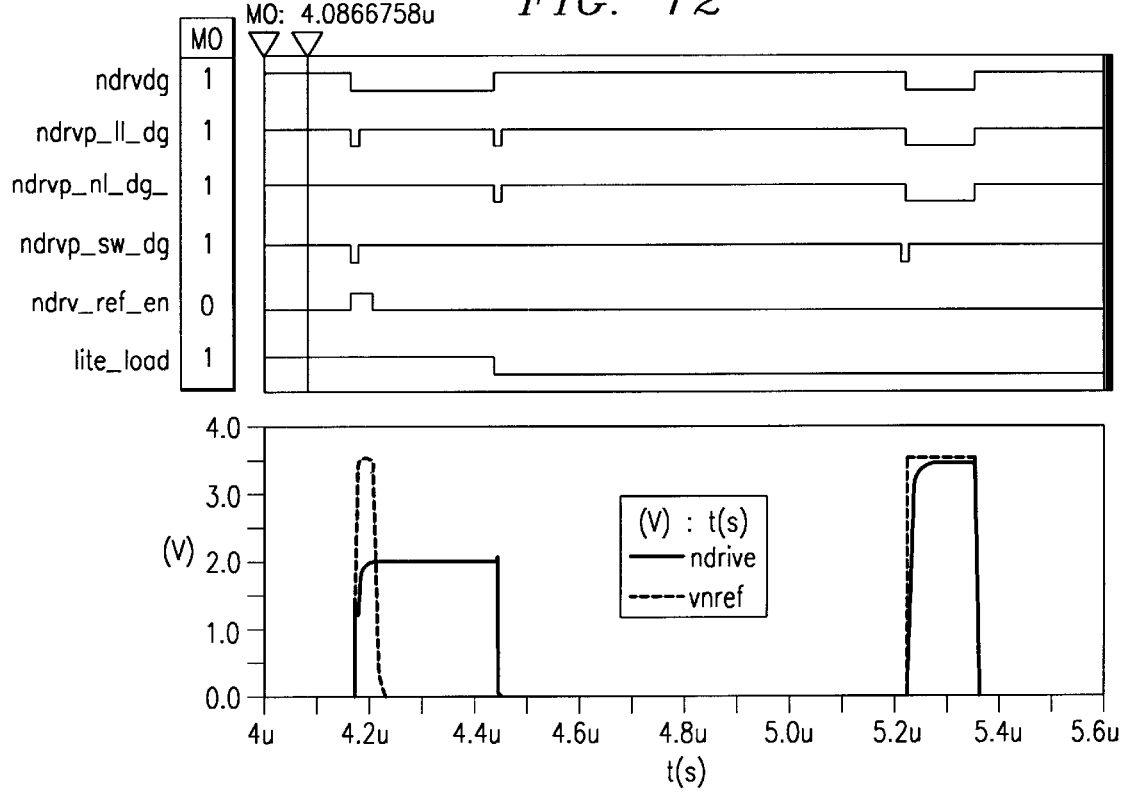
FIG. 12 is a timing diagram illustrating various switching regulator signals associated with N-drive control signal timing under both light and normal loading for the switching regulator shown in FIG. 10.
Figure 13:
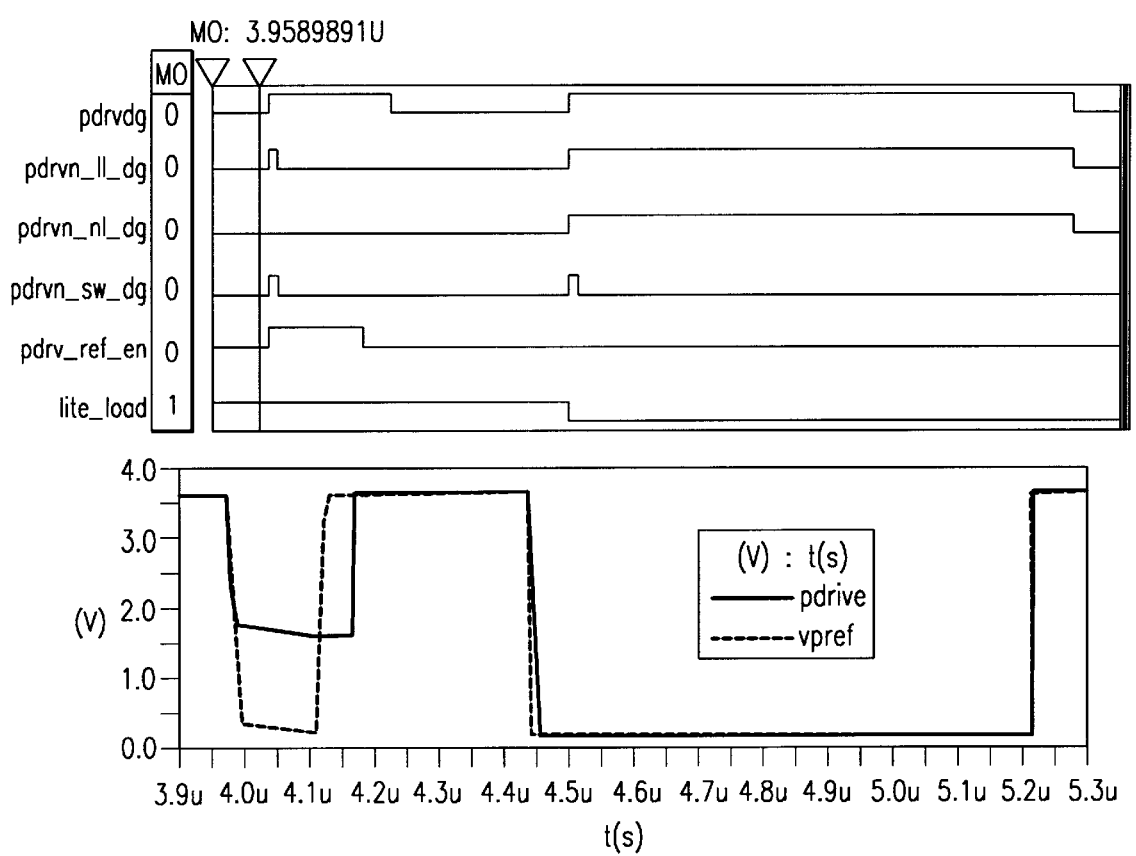
FIG. 13 is a timing diagram illustrating various switching regulator signals associated with P-drive control signal timing under both light and normal loading for the switching regulator shown in FIG. 10.
Figure 14:
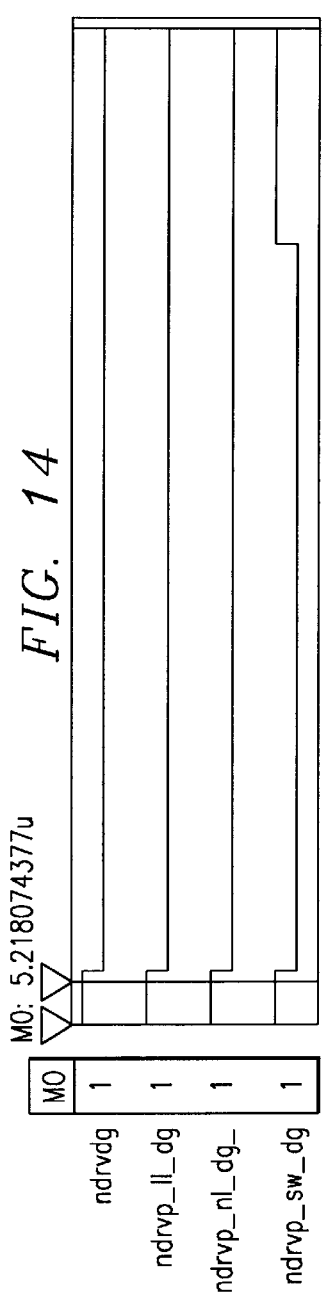
FIG. 14 is a graph illustrating the current contribution of each turn-on FET to turning its respective output FET device on during normal load conditions.
Figure 14:
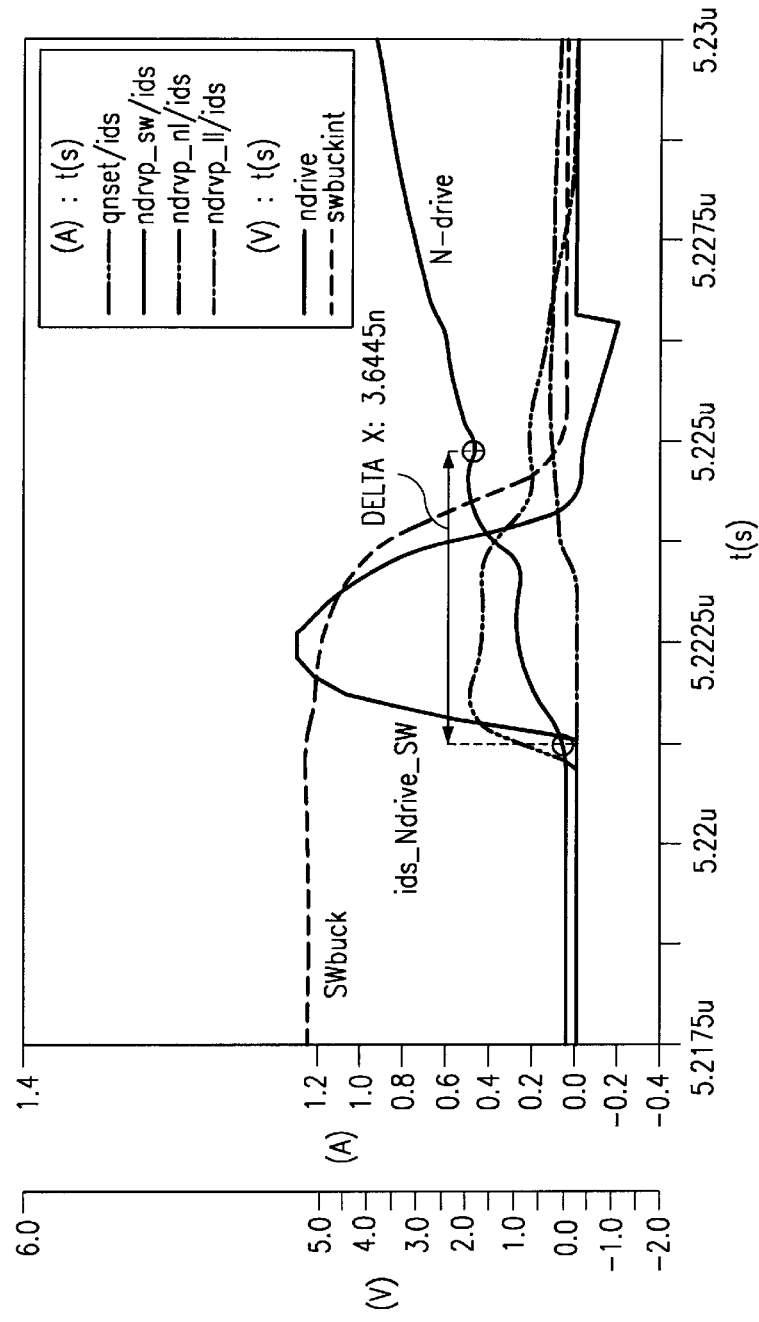

FIGS. 12 and 13 are timing diagrams illustrating various switching regulator signals associated with N-drive and P-drive control signal timing respectively under both light and normal loading for the switching regulator shown in FIG. 10; while FIG. 14 illustrates the current contribution of the N-drive FET 1010 toward turning the output NMOS FET 106 on during normal loading conditions. Importantly, most of the requisite energy is provided by the inductor 1002 as well as the output FET parasitic capacitance through each respective $Q_{on}$_SW 1008, 1010. Known structures and techniques actually waste this energy back to the supply. In contradistinction, using the present inventive techniques described herein above, each gate drive $Q_{on}$_SW 1008, 1010 is seen to receive more 'free' energy from the output switching node 102 as the respective $Q_{on}$_SW 1008, 1010 increases in size, within certain limits.

In summary explanation of the above, the present MOS-based switch mode dc-dc power converter (switching regulator) has the gate drive of the output FET devices configured such that the ON-time driver FET devices have their source coupled to the output switching node, unlike known architectures that use a power supply to drive the output FET devices in a binary (on/off) manner.

The present high efficiency dc-dc switching regulator uses a detecting circuit technique to sense the output switching node voltage to determine light load conditions. This technique is advantageous since known techniques employ an additional comparator to trigger special light load functions which is more costly and often unnecessary.

Subsequent to detecting light load conditions and turn-on of an output FET by its respective ON-time driver FET, a voltage setting circuit technique drives the gate switching voltage $V_{gs}$ of the respective output FET to a certain minimal value that guarantees a maximum $R_{ds}$ON, and generates a signal to end the $V_{gs}$ setting process according to the present invention. One embodiment comprises a small reference and source follower circuit that forces $V_{gs}$ to a set value. This technique offers cost savings over known techniques that employ a linear regulator and large capacitor(s) to control the $V_{gs}$ drive level of only the N-drive. The present technique further provides for improved efficiency and addresses the P-drive requirements not heretofore addressed in prior art structures and techniques.

The present high efficiency dc-dc switching regulator recirculates inductor current, thereby providing a substantial portion of the gate drive energy necessary to drive the output FET devices, and providing a significant efficiency boost during both light and normal load conditions. Known structures waste the inductor energy by failing to recognize that most of the energy necessary to turn a FET on could be provided by otherwise wasted inductor energy.

The present high efficiency dc-dc switching regulator employs a switching technique that exactly times the output FET gate drive turn-off to provide a smooth, no loss, clamping of the $V_{gs}$ signal. This technique offers substantial benefits over known techniques that use costly constant $V_{gs}$ regulated power sources.

The present high efficiency dc-dc switching regulator automatically clamps the output switching node when in discontinuous mode, from ringing one $V_t$ above $V_{dd}$ or below ground when all output FET devices are off, thereby reducing costly PCB area requirements and efficiency losses due to parasitic capacitances associated with Schotkey diodes employed in known switching regulator structures.

One embodiment of the present high efficiency dc-dc switching regulator employs a small ON-time driver FET to force a full $V_{gs}$ swing thereby guaranteeing a minimum gate drive speed during normal load operation. This feature renders a system designer capable of meeting timing specifications even under the worst case capacitive loading and highest supply voltage $V_{dd}$ conditions. Similarly, one embodiment employs a small ON-time driver FET to ensure the requisite output FET turns on during light load conditions, even at the lowest supply voltage $V_{dd}$.

In view of the foregoing, it is seen that the above described voltage setting circuit technique as well as the small ON-time driver FET devices assist to quickly turn on the requisite output FET. This combinatorial technique reduces wasted die area and efficiently utilizes all available assets to deliver the normal load mode signals necessary to provide the present high efficiency switching dc-dc regulator.

This invention has been described in considerable detail in order to provide those skilled in switching regulator design with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, although various embodiments have been presented herein with reference to particular circuit architectures and associated components, the present inventive structures and methods are not necessarily limited to the particular circuit architectures or types of components as exemplified herein. Depending upon the particular application, for example, a component can mean a single element or any combination of elements, so long as the present functionality described and claimed herein is preserved.

What is claimed is:

1. A switching voltage regulator for supplying a regulated output voltage to a load, the regulator comprising:

a switching circuit having a switch node and configured for alternating an input voltage applied to an inductor that is coupled to the switch node in response to control signals such that the switching circuit can supply a regulated voltage to the switch node having an inductor coupled; thereto; and a switching control circuit coupled to the switch node and configured to acquire energy from an inductor coupled to the switch node and therefrom generate the control signals, and further configured to transfer energy from an inductor coupled to the switch node to the switching circuit thereby rendering the switching circuit capable of maintaining a regulated voltage at the switch node.

2. The switching voltage regulator according to claim 1 further comprising a timing control circuit coupled to the switch node and the switching control circuit and configured to sense a regulated voltage at the switch node and therefrom generate timing control signals such that the switching control circuit will be capable of selectively transferring predetermined quantities of energy to the switching circuit from an inductor coupled to the switch node.

3. The switching voltage regulator according to claim 2 wherein the timing control circuit comprises a FET $V_{gs}$ setting circuit.

4. The switching voltage regulator according to claim 3 wherein the FET $V_{gs}$ setting circuit comprises a diode clamping circuit.

5. The switching voltage regulator according to claim 3 wherein the FET $V_{gs}$ setting circuit comprises a linear regulator.

6. The switching voltage regulator according to claim 3 wherein the FET $V_{gs}$ setting circuit comprises a FET clamping circuit in combination with a reference voltage regulator circuit.

7. The switching voltage regulator according to claim 6 wherein the reference voltage circuit comprises a current source in combination with a resistor/diode circuit.

8. The switching voltage regulator according to claim 6 wherein the reference voltage circuit comprises a linear regulator circuit.

9. The switching voltage regulator according to claim 3 wherein the FET $V_{gs}$ setting circuit comprises a FET voltage forcing circuit in combination with a reference voltage regulator circuit.

10. The switching voltage regulator according to claim 9 wherein the reference voltage circuit comprises a current source in combination with a resistor/diode circuit.

11. The switching voltage regulator according to claim 9 wherein the reference voltage circuit comprises a linear regulator circuit.

12. The switching voltage regulator according to claim 1 wherein the switching circuit comprises a main PMOS FET and a main NMOS FET, the main PMOS FET having a gate, a source coupled to a switching regulator supply voltage and a drain coupled to the switch node and the main NMOS FET having a gate, a source coupled to a switching regulator ground and a drain coupled to the switch node.

13. The switching voltage regulator according to claim 1 wherein the switching control circuit comprises a NMOS FET having a gate coupled to a switching voltage regulator ground, a drain coupled to the main PMOS FET gate and a source coupled to the switch node, wherein the NMOS FET is configured to transfer energy from the gate of the main PMOS FET to the switch node until a predetermined gate switching voltage $V_{gs}$ is attained for the main PMOS FET.

14. The switching voltage regulator according to claim 13 wherein the switching control circuit further comprises a PMOS FET having a gate coupled to a voltage reference, a drain coupled to the main NMOS FET -gate and a source coupled to the switch node, wherein the PMOS FET is configured to transfer energy to the gate of the main NMOS FET from the switch node until a predetermined gate switching voltage $V_{gs}$ is attained for the main NMOS FET.

15. A switching voltage regulator for supplying a regulated output voltage to a load, the regulator comprising:

a switch node;

a switching circuit including a main PMOS FET having a gate, a source coupled to a voltage regulator supply voltage and a drain coupled to the switch node and further including a main NMOS FET having a gate, a source coupled to a voltage regulator ground and a drain coupled to the switch node;

a switching control circuit including a Pdrive NMOS FET having a gate coupled to a switching voltage regulator ground, a drain coupled to the main PMOS FET gate and a source coupled to the switch node, wherein the Pdrive NMOS FET is configured to transfer energy from the gate of the main PMOS FET to the switch node until a predetermined gate switching voltage $V_{gs}$ is attained for the main PMOS FET, the switching control circuit further including an Ndrive PMOS FET having a gate coupled to a voltage reference, a drain coupled to the main NMOS FET gate and a; source coupled to the switch node, wherein the Ndrive PMOS FET is configured to transfer energy to the gate of the main NMOS FET from the switch node until a predetermined gate switching voltage $V_{gs}$ is attained for the main NMOS FET; and a timing control circuit coupled to the switch node and the switching control circuit and configured to sense a threshold voltage at the switch node and therefrom generate timing control signals such that the switching control circuit will alternatingly generate a predetermined gate switching voltage associated with each of the main FETs.

16. The switching voltage regulator according to claim 15 wherein the timing control circuit comprises a FET $V_{gs}$ setting circuit.

17. The switching voltage regulator according to claim 16 wherein the FET $V_{gs}$ setting circuit comprises a diode clamping circuit.

18. The switching voltage regulator according to claim 16 wherein the FET $V_{gs}$ setting circuit comprises a linear regulator.

19. The switching voltage regulator according to claim 16 wherein the FET $V_{gs}$ setting circuit comprises a FET clamping circuit in combination with a reference voltage regulator circuit.

20. The switching voltage regulator according to claim 19 wherein the reference voltage circuit comprises a current source in combination with a resistor/diode circuit.

21. The switching voltage regulator according to claim 19 wherein the reference voltage circuit comprises a linear regulator circuit.

22. The switching voltage regulator according to claim 16 wherein the FET $V_{gs}$ setting circuit comprises a FET voltage forcing circuit in combination with a reference voltage regulator circuit.

23. The switching voltage regulator according to claim 22 wherein the reference voltage circuit comprises a current source in combination with a resistor/diode circuit.

24. The switching voltage regulator according to claim 22 wherein the reference voltage circuit comprises a linear regulator circuit.

25. A switching voltage regulator for supplying a regulated output voltage to a load, the regulator comprising:
   a switch node;
   switching means for alternating an input voltage applied to an inductor that is coupled to the switch node in response to a control signal such that the switching means can supply a regulated voltage to the switch node;
   controlling means for generating the control signal in response to timing control signals; and
   timing means for sensing a regulated voltage at the switch node and therefrom generating the timing control signals such that the controlling means will feedback energy to the switching means from an inductor coupled to the switch node thereby rendering the switching means capable of maintaining a regulated voltage at the switch node having an inductor coupled thereto.

26. The switching voltage regulator according to claim 25 wherein the switching means comprises a main PMOS FET having a gate, a source coupled to a voltage regulator supply voltage and a drain coupled to the switch node and further including a main NMOS FET having a gate, a source coupled to a voltage regulator ground and a drain coupled to the switch node.

27. The switching voltage regulator according to claim 25 wherein the controlling means comprises a Pdrive NMOS FET having a gate coupled to a voltage reference, a drain coupled to the main PMOS FET gate and a source coupled to the switch node, wherein the Pdrive NMOS FET is configured to transfer energy from the gate of the main PMOS FET to the switch node until a predetermined gate switching voltage $V_{gs}$ is attained for the main PMOS FET, the switching control circuit further including an Ndrive PMOS FET having a gate coupled to a voltage reference, a drain coupled to the main NMOS FET gate and a source coupled to the switch node, wherein the Ndrive PMOS FET is configured to transfer energy to the gate of the main NMOS FET from the switch node until a predetermined gate switching voltage $V_{gs}$ is attained for the main NMOS FET.

28. The switching voltage regulator according to claim 25 wherein the timing means comprises a FET $V_{gs}$ setting circuit.

29. The switching voltage regulator according to claim 28 wherein the FET $V_{gs}$ setting circuit comprises a diode clamping circuit.

30. The switching voltage regulator according to claim 28 wherein the FET $V_{gs}$ setting circuit comprises a linear regulator.

31. The switching voltage regulator according to claim 28 wherein the FET $V_{gs}$ setting circuit comprises a FET clamping circuit in combination with a reference voltage regulator circuit.

32. The switching voltage regulator according to claim 31 wherein the reference voltage circuit comprises a current source in combination with a resistor/diode circuit.

33. The switching voltage regulator according to claim 31 wherein the reference voltage circuit comprises a linear regulator circuit.

34. The switching voltage regulator according to claim 28 wherein the FET $V_{gs}$ setting circuit comprises a FET voltage forcing circuit in combination with a reference voltage regulator circuit.

35. The switching voltage regulator according to claim 34 wherein the reference voltage circuit comprises a current source in combination with a resistor/diode circuit.

36. The switching voltage regulator according to claim 34 wherein the reference voltage circuit comprises a linear regulator circuit.

37. A MOSFET switching system comprising:
   at least one NMOS FET;
   at least one PMOS FET connected to the at least one NMOS FET to formulate a totem-pole configuration having a common switch node;
   inductive and capacitive elements connected to the common switch node; and
   a gate drive system connected to the common switch node and configured such that the gate drive system in association with the inductive and capacitive elements controllably limit gate switching voltages ($V_{gs}$) for the at least one NMOS FET and the at least one PMOS FET in response to a control reference voltage generated at the common switch node.

38. The MOSFET switching system according to claim 37 wherein the at least one NMOS FET and the at least one PMOS FET are further configured for alternating an input voltage applied to the inductive and capacitive elements in response to control signals generated by the gate drive system such that a regulated voltage is generated at the common switch node.

39. The MOSFET switching system according to claim 38 wherein the gate drive system is further configured to acquire energy from at least one of the inductive elements and therefrom generate the control signals.

40. The MOSFET switching system according to claim 39 wherein the gate drive system is further configured to transfer energy from at least one of the inductive elements to the at least one NMOS FET and the at least one PMOS FET thereby rendering the at least one NMOS FET and the at least one PMOS FET capable of maintaining the regulated voltage at the common switch node.

41. The MOSFET switching system according to claim 37 wherein the gate drive system comprises a FET $V_{gs}$ setting circuit.

42. The MOSFET switching system according to claim 41 wherein the FET $V_{gs}$ setting circuit comprises a diode clamping circuit.

43. The MOSFET switching system according to claim 41 wherein the FET $V_{gs}$ setting circuit comprises a linear regulator.

44. The MOSFET switching system according to claim 41 wherein the FET $V_{gs}$ setting circuit comprises a FET clamping circuit in combination with a reference voltage regulator circuit.

45. The MOSFET switching system according to claim 44 wherein the reference voltage circuit comprises a current source in combination with a resistor/diode circuit.

46. The MOSFET switching system according to claim 44 wherein the reference voltage circuit comprises a linear regulator circuit.

47. The MOSFET switching system according to claim 41 wherein the FET $V_{gs}$ setting circuit comprises a FET voltage forcing circuit in combination with a reference voltage regulator circuit.

48. The MOSFET switching system according to claim 47 wherein the reference voltage regulator circuit comprises a current source in combination with a resistor/diode circuit.

49. The MOSFET switching system according to claim 47 wherein the reference voltage regulator circuit comprises a linear regulator circuit.

\* \* \* \* \*